United States Patent [19]
Le Letty

[11] Patent Number: 6,040,654
[45] Date of Patent: Mar. 21, 2000

[54] PIEZOELECTRIC TRANSFORMER

[75] Inventor: Ronan Le Letty, Grenoble, France

[73] Assignee: Eta SA Fabriques d'Ebauches, Grenchen, Switzerland

[21] Appl. No.: 09/131,888

[22] Filed: Aug. 10, 1998

[30] Foreign Application Priority Data

Aug. 15, 1997 [CH] Switzerland ............................. 1924/97

[51] Int. Cl.[7] .................................................. H01L 41/08
[52] U.S. Cl. .......................... 310/366; 310/358; 310/359
[58] Field of Search ................................... 310/357–359, 310/366, 369

[56] References Cited

U.S. PATENT DOCUMENTS

| | | | |
|---|---|---|---|
| 2,976,501 | 3/1961 | Mattiat | 310/359 X |
| 5,814,922 | 9/1998 | Uchino et al. | 310/359 |

*Primary Examiner*—Mark O. Budd
*Attorney, Agent, or Firm*—Sughrue, Mion, Zinn, Macpeak & Seas, PLLC

[57] ABSTRACT

The transformer (1) includes a body (2) made of piezoelectric material having an outer lateral surface (E) in the shape of a circular cylinder. Primary electrodes (5, 7, 10, 12, 17, 19, 22, 24) are arranged on the body (2) so that, when the primary voltage (Up) which is applied thereto has a determined frequency (fr), the outer lateral surface (E) alternately takes the shape of a first and a second elliptical cylinder, the major axes of these latter being perpendicular to each other and perpendicular to the axis (A) of the circular cylinder.

This vibration mode of the body (2) has a lower fundamental resonance frequency than that of the vibration mode of known transformer bodies having the same space requirement. The transformer (1) is thus well suited to being used in devices where the available space is limited for providing a relatively high AC voltage but having a relatively low frequency.

14 Claims, 5 Drawing Sheets

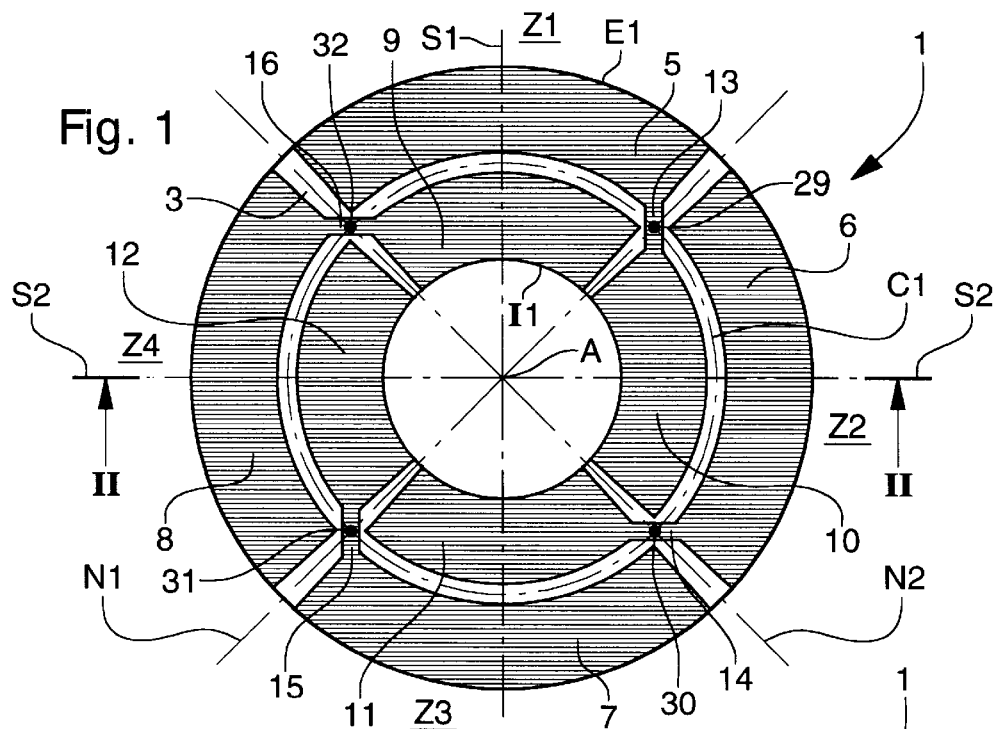
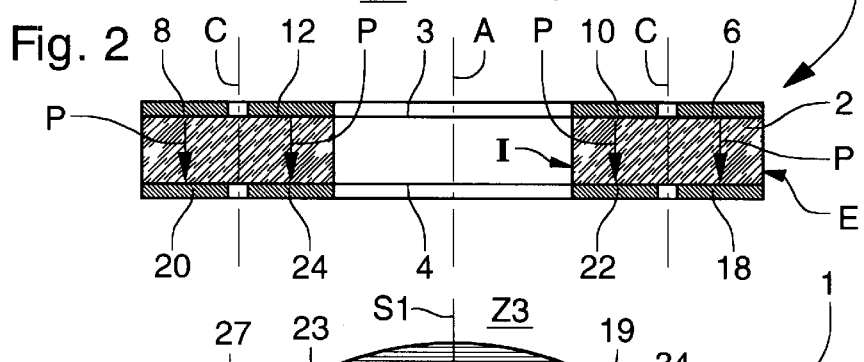
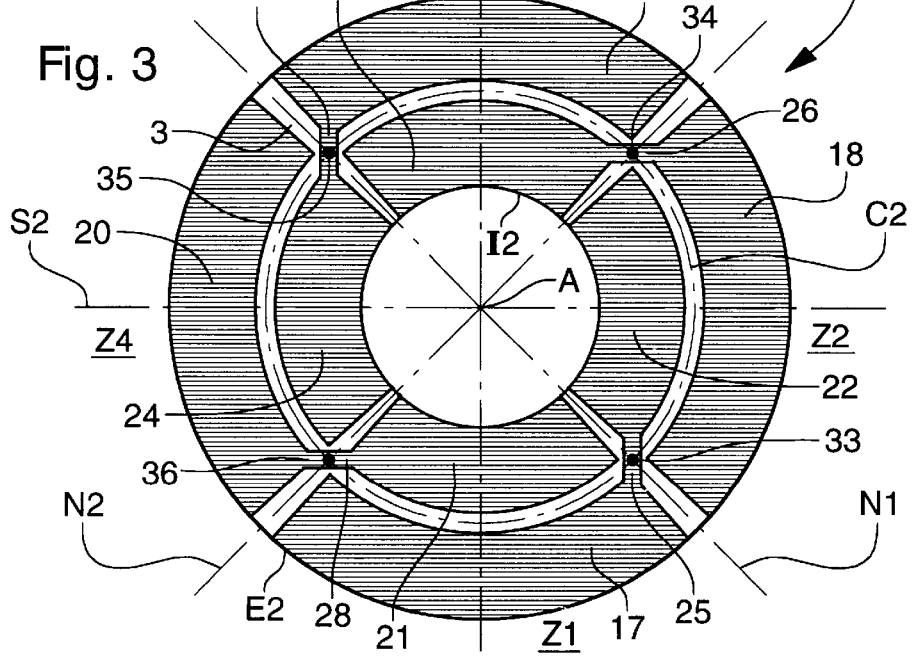

PIEZOELECTRIC TRANSFORMER

The present invention concerns a piezoelectric transformer including:

a body made of piezoelectric material having a first and a second face and an outer lateral surface;

a plurality of primary electrodes arranged on said body to cause vibration of said body in response to a primary AC voltage; and a plurality of secondary electrodes arranged on said body to generate a secondary voltage in response to said vibration;

said outer surface having, in the absence of said vibration, the shape of a first circular cylinder having a circular axis of symmetry and said faces each having an outer portion situated on the side of said outer lateral surface and an inner portion surrounded by said outer portion.

A piezoelectric transformer having these features is disclosed in U.S. Pat. No. 2,974,296 where it is shown in FIG. 1. The body of this transformer has the shape of an elongated hollow cylinder which is polarised axially. The primary voltage is applied between two electrodes surrounding the body on either side of the middle thereof lengthways, so that said body vibrates in a longitudinal mode. The secondary voltage is received between two electrodes surrounding the body, each at one of the ends thereof.

In addition to the drawbacks which are common to all known transformers and which will be mentioned hereinafter, this transformer has the drawback of being relatively difficult to manufacture in large numbers due to its elongated hollow circular cylindrical shape. The cost price thereof is thus relatively high.

Another transformer which also has the above features is also disclosed in the same U.S. Pat. No. 2,974,296 where it is shown in FIG. 8. The body of this transformer has the shape of a circular disc whose central portion is polarised axially and the outer annular portion is polarised radially. The primary voltage is applied between two electrodes arranged on either side of the central portion of the body, so that the latter vibrates in a radial mode. The secondary voltage is received between one of these latter electrodes and a third electrode arranged on the lateral surface of the body.

Yet another transformer having the above features is disclosed in the same U.S. Pat. No. 2,974,296 where it is shown in FIG. 9. The body of this transformer has the shape of a circular ring whose first half, in a plane view, is polarised axially. The second half of this ring is formed of two tangentially polarised portions, the direction of polarisation of these two portions being opposite to each other. The primary voltage is applied between two electrodes arranged on either side of the first half of the ring, so that the body vibrates in what is called a tangential mode. The secondary voltage is received between one of these two electrodes and a third electrode surrounding the second half of the ring at the place where the two portions which are polarised in opposite directions are joined.

The two transformers which have just been described also have, amongst other drawbacks, the drawback of being relatively difficult to manufacture, due to the fact that their body includes several portions which must be polarised differently. Their cost price is therefore also relatively high.

The means which provide the primary voltage necessary for the operation of the known transformers described hereinbefore are obviously arranged so that the body of said transformers vibrates at one of its vibration mode resonance frequencies. The frequency of the secondary voltage generated in response to this vibration is obviously equal to the frequency of this latter. The minimum frequency of said secondary voltage is thus equal to the fundamental resonance frequency of the mode in which the transformer body vibrates.

It is known that, generally speaking, the fundamental resonance frequency of any object vibrating in one of its vibration modes, and thus in particular of the body of a piezoelectric transformer, depends amongst other things upon the dimensions of said object and that, all other things being equal, the smaller the dimensions of the object, the higher the fundamental resonance frequency.

It follows from the foregoing and from the features of the aforementioned known transformers that, if one wishes to use one of these known transformers in a device in which the space available is very limited, the fundamental resonance frequency of the transformer body will have to be high, as of course, will the frequency of the secondary voltage provided by said transformer.

An example of such a device in which the available space is very limited is a wristwatch in which the case, whose inner diameter is generally no more than three or four centimeters, has to hold numerous components.

Those skilled in the art will easily see that if one wishes to place a known piezoelectric transformer such as those mentioned hereinbefore in a wristwatch, the dimensions of the body of the known transformer must be so small that the fundamental resonance frequency of the body, and thus the minimum resonance frequency of the secondary voltage generated by the transformer, has a value which is greater than one hundred kilohertz and able, according to the particular case, to reach several megahertz.

Use of an AC voltage having such a high frequency can sometimes cause problems.

Thus, for example, losses due to stray capacitances inevitably formed by the various conductors subjected to this voltage can become excessive, and these stray capacitances can disrupt normal operation of the device.

Likewise, the consumption of the circuit intended to provide the transformer with its primary voltage, which must obviously have the same frequency as the secondary voltage, can become excessive since, generally, the higher the frequency the greater the consumption.

Moreover, a voltage having such a high frequency can not be used for all purposes.

Thus, for example, it is known that a lighting device or electroluminescent display device, which it is often advantageous to use in a watch, must be supplied by an AC voltage having an amplitude of several tens of volts. A watch is generally supplied by a battery or an accumulator providing a direct current (DC) voltage of the order of 1.5 to 3 volts. Such a DC voltage can easily be converted into an AC voltage with the aid of a simple electronic circuit, but the amplitude of this AC voltage is obviously also of the order of 1.5 to 3 volts.

It is thus necessary to provide a transformer for supplying energy to an electroluminescent device in a watch, and a piezoelectric transformer would, at first sight, seem particularly well suited to such use.

However, it is also known that the lifespan of an electroluminescent device decreases rapidly if the frequency of its supply voltage passes several tens of kilohertz, for example 30 or 40 kilohertz. Such a device cannot therefore be supplied by the voltage provided by a known piezoelectric transformer, since the frequency of such voltage is much too high.

It can be mentioned here that other piezoelectric transformers are also disclosed in aforementioned U.S. Pat. No.

2,974,296, and in U.S. Pat. Nos. 5,241,236, 5,365,141, 5,371,430 and 5,440,195. However, these transformers cannot be used to resolve the aforementioned problem since, when their space requirement is small, the fundamental resonance frequency of their body's vibration mode is also very high. It should also be noted that the body of all these transformers has the shape of a parallelepiped rectangle, and that these transformers do not therefore meet the general definition given hereinbefore.

An object of the present invention is thus to provide a piezoelectric transformer which meets this general definition which has sufficiently small dimensions that it can easily be used in a device in which the available space is limited, while being arranged so that its body vibrates in a mode having a sufficiently low fundamental frequency that the secondary voltage which it generates can be used in all cases where the frequency of the secondary voltage generated by a known transformer having the same space requirement is too high.

This object is achieved by the piezoelectric transformer whose features are listed in claim 1 annexed hereto.

Other objects and advantages of the present invention will be made clear by the description of some of the embodiments thereof selected by way of non limiting examples, such description being made hereinafter with reference to the annexed drawing, in which:

FIG. 1 shows schematically a first face of a piezoelectric transformer according to the present invention;

FIG. 2 shows schematically a cross-section of the transformer of FIG. 1 made along the axis II—II of FIG. 1;

FIG. 3 shows schematically the second face of the transformer of FIG. 1;

FIGS. 1 to 3 show schematically an embodiment of the transformer according to the present invention, designated by the general reference 1.

Figure 4:
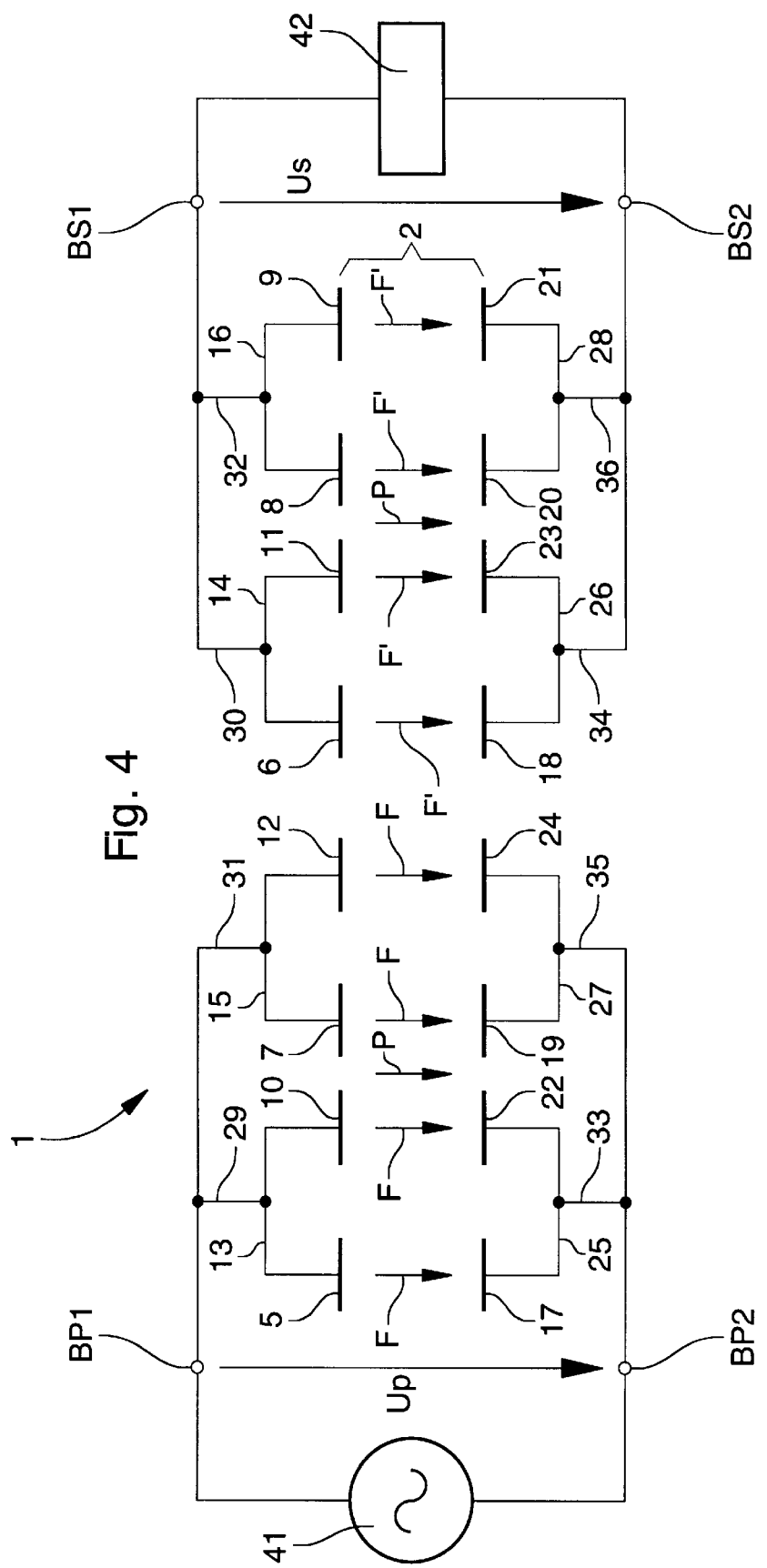
FIG. 4 illustrates schematically a way of operating the transformer of FIGS. 1 to 3.

Transformer 1 includes a body 2 formed of a single part made of a piezoelectric material the nature of which will not be described since it may be any one of the various piezoelectric materials well known to those skilled in the art.

When transformer 1 is not operating, body 2 has the shape of a cylindrical ring having two flat faces 3 and 4 parallel to each other and respectively shown in FIGS. 1 and 3.

The outer and inner lateral surfaces of body 2 each have the shape of a straight circular cylinder having a circular axis of symmetry designated by the reference A. These outer and inner lateral surfaces and the cylinders which form them will be designated respectively by the references E and I. Moreover, the intersections of these lateral surfaces E and I with the planes of faces 3 and 4, which form the external and internal contours of said faces 3 and 4 and which are evidently circles centred on axis A, will be respectively designated by the references E1, E2, I1 and I2.

For a reason which will become obvious hereinafter, the straight circular cylinder, which has the same axis as axis A and a diameter equal to the arithmetical mean of the diameters of the cylinders forming lateral surfaces E and I, is shown in dot and dash lines in FIG. 2 with the reference C. Moreover, the traces of this cylinder C in faces 3 and 4 have also been shown in FIGS. 1 and 3 in dot and dash lines with the respective references C1 and C2.

The piezoelectric material of body 2 is uniformly polarised in a direction parallel to axis A and in a direction which goes from face 3 towards face 4. This polarisation is symbolised by the arrows P shown in FIG. 2.

Transformer 2 also includes eight electrodes arranged on face 3 of body 2 and designated by the references 5 to 12.

Amongst these electrodes, electrodes 5 to 8 are arranged at the periphery of face 3, on the exterior of circle C1. These electrodes 5 to 8 thus occupy a little less than half of the width of face 3 and are each disposed within an angle at centre of slightly less than 90°. Moreover, these electrodes 5 to 8 are electrically insulated from each other.

For a reason which will become clear hereinafter, FIGS. 1 and 3 also show, with the references N1 and N2, the two planes which intersect axis A forming four angles of 90° and which pass between electrodes 5 and 6 on the one hand and 7 and 8 on the hand, and respectively between electrodes 5 and 8 on the one hand and 6 and 7 on the other hand. The traces of these planes N1 and N2 are indicated in FIGS. 1 and 3 by dot and dash lines by the same references. Moreover, the four zones of space which are defined by these planes N1 and N2 and which each contain one of electrodes 5 to 8 will be designated respectively by the references Z1 to Z4.

Electrodes 9 to 12 are arranged on the inner portion of face 3 of body 2, inside circle C1, and also occupy a little less than half of the width of said face 3 while leaving an insulating space between them and electrodes 5 to 8. These electrodes 9 to 12 are also each disposed in an angle at centre of slightly less than 90°, and are respectively situated in zones Z1 to Z4 defined hereinbefore.

Electrodes 9 to 12 are also electrically insulated from each other, but each of them is connected to one, and only one, of electrodes 5 to 8 by conductive paths designated by the references 13 to 16.

More precisely, paths 13 to 16 connect respectively electrodes 5 and 10, 6 and 11, 7 and 12 and 8 and 9. Moreover, paths 13 to 16 are arranged so that each of them engulfs one of the points where the traces of planes N1 and N2 intersect middle circle C1.

Transformer 1 further includes eight other electrodes arranged on face 4 of body 2 and designated by the references 17 to 24. These electrodes 17 to 24 are respectively situated facing electrodes 5 to 12 and are thus similar to the latter. Electrodes 17 to 24 will not therefore be described in more detail. It will simply be mentioned that conductive paths 25 to 28 connect respectively electrodes 17 and 22, 18 and 23, 19 and 24 and 20 and 21. Moreover, these paths 25 to 28 are arranged so that each of them engulfs one of the points where the traces of planes N1 and N2 intersect circle C2.

It is to be noted that the thickness of electrodes 6, 8, 10, 12, 18, 20, 22 and 24 which are visible in cross-section in FIG. 2 have been greatly exaggerated in order to improve the clarity of said FIG. 2. Those skilled in the art will understand that these electrodes, as well as all those which are not visible and conductive paths 13 to 16 and 25 to 28, are made in a conventional manner by simple deposition of an extremely thin metal layer on faces 3 and 4 of body 2.

Transformer 1 also includes means for connecting its electrodes 5 to 12 and 17 to 24 to the circuits which supply it with the voltage for exciting vibration of its body 2 and which use the voltage resulting from such vibration. The vibration and the manner in which it generates this latter voltage will be described hereinafter.

In the present example, these connection means are formed by rods 29 to 36 which are made of conductive material and each have one end fixed, for example by bonding, to one of conductive paths 13 to 16 and 25 to 28.

Moreover, for a reason which will become clear hereinafter, these rods 29 to 36 are preferably fixed to paths 13 to 16 and 25 to 28 at the points where the traces of planes N1 and N2 intersect circles C1 and C2, as is shown in FIGS. 1 and 3.

Upon reading the description of the operation of transformer 1 which will be made hereinafter, those skilled in the art will easily understand that these rods 29 to 36, or at least certain of them, can also be used to fix transformer 1 mechanically onto a suitable support.

Before beginning the description of the operation of transformer 1, it will be stressed that this latter includes two planes of symmetry S1 and S2 which are perpendicular to each other, and which are at the same time the bisecting planes of the angles formed by the aforementioned planes N1 and N2. The traces of these planes S1 and S2 are indicated in FIGS. 1 and 3 by dot and dash lines bearing the same references.

It can be seen that each of electrodes 5, 7, 9, 11, 17, 19, 21 and 23 is symmetrical with respect to plane S1, and that each of electrodes 6, 8, 10, 12, 18, 20, 22 and 24 is symmetrical with respect to plane S2. Moreover, electrodes 5, 9, 17 and 21 are respectively symmetrical to electrodes 7, 11, 19 and 23 with respect to plane S2, whereas electrodes 6, 10, 18 and 22 are respectively symmetrical to electrodes 8, 12, 20 and 24 with respect to plane S1.

The operation of transformer 1 described hereinbefore will be explained in relation to a particular case, taken by way of non limiting example, illustrated in FIG. 4.

In this example, connection rods 29 and 31 are electrically connected to each other, and to a terminal BP1. Likewise, connection rods 33 and 35 are electrically connected to each other, and to a terminal BP2. Moreover, connection rods 30 and 32 are electrically connected to each other and to a terminal BS1 and connection rods 34 and 36 are also electrically connected to each other and to a terminal BS2.

These connections between connection rods 29 to 36 and terminals BP1, BP2, BS1 and BS2 will not be described in more detail since those skilled in the art will have no problem in the making thereof.

As will become clear hereinafter, terminals BP1 and BP2 are intended to receive the AC voltage applied to transformer 1, or the primary voltage. Likewise, terminals BS1 and BS2 are those across which the voltage generated by transformer 1, or the secondary voltage, can be received. These primary and secondary voltages will be respectively called voltage Up and voltage Us.

Those skilled in the art will easily understand that terminals BP1 and BP2 can very well not exist in practice, voltage Up then being applied directly across connection rods 29 and 33, for example. Likewise, terminals BS1 and BS2 can very well not exist, voltage Us being then directly received across connection rods 30 and 34, for example.

Electrodes 5 to 12 and 17 to 24 of transformer 1 are also shown very schematically in FIG. 4, as are conductive paths 13 to 16 and 25 to 28.

It can be seen that, in this case, electrodes 5, 7, 10 and 12 are connected to each other and to terminal BP1, as are electrodes 17, 19, 22 and 24 to terminal BP2. Moreover, electrodes 6, 8, 9 and 11 are connected to each other and to terminal BS1, as are electrodes 18, 20, 21 and 23 to terminal BS2.

In other words, on each of faces 3 and 4 of body 2, the outer electrodes situated in two diametrically opposite zones are connected to each other and to the inner electrodes situated in the two other zones. Thus, for example, outer electrodes 5 and 7 situated on face 3 in zones Z1 and, respectively, Z3, are connected to inner electrodes 10 and 12 situated on the same face 3 but in zones Z2 and, respectively, Z4.

The source supplying transformer 1 with primary AC voltage Up and the device supplied by secondary AC voltage Us provided by transformer 1 are also shown in FIG. 4 with the references 41 and, respectively, 42.

Source 41 will not be described since it can be made in any manner. Moreover, those skilled in the art will easily understand that primary voltage Up can have any shape. In particular, this voltage Up can be sinusoidal, or have the shape generally classified as square in which it has alternately a first constant value and a second constant value equal in absolute value to the first but of the opposite sign thereto.

The precise nature of device 42 will not be specified here since it may be any one of the various devices which have to be supplied by an AC voltage such as voltage Us.

It can be seen that AC voltage Up causes the application of an electric field F, which is also AC, to four portions of body 2, which are respectively situated between the pairs of electrodes 5 and 17, 7 and 19, 10 and 22, and 12 and 24. In the following description, these electrodes 5, 7, 10, 12, 17, 19, 22 and 24 will be called the primary electrodes, and the portions of body 2 which they delimit will be called the primary portions of body 2.

Electric field F has a direction parallel to that of axis A, and thus parallel to the direction of polarisation P of the material of body 2, and a direction which is alternately the same as that of said polarisation P and the opposite direction.

In a known manner, the transverse electromechanical coupling of field F with the material of body 2, commonly called electromechanical coupling 31, causes the application of mechanical stresses to the four primary portions of body 2 defined hereinbefore. As field F alternately has the two aforementioned directions, these mechanical stresses alternately cause, again in a well known manner, a contraction and an expansion of these four primary portions in all directions perpendicular to axis A.

It can be seen that a first and a second of these four primary parts defined hereinbefore, i.e. those which are situated between electrodes 5 and 17 and, respectively, 7 and 19, are outer portions of body 2 respectively situated in a first and a second of the four zones which are also defined hereinbefore, i.e. zones Z1 and Z3. These first and second primary portions are symmetrical to each other with respect to plane S2 and each of them is symmetrical with respect to plane S1.

It can also be seen that the third and the fourth primary portion, i.e. those which are situated between electrodes 10 and 22, and respectively, 12 and 24, are inner portions of body 2 respectively situated in the third and fourth zone of body 2, i.e. zones Z2 and Z4. These third and fourth primary portions are symmetrical to each other with respect to plane S1, and each of them is symmetrical with respect to plane S2.

It is clear that these four primary portions are subjected to the same stresses whether expansion or contraction in response to electric field F.

Due to the fact that two of these primary portions are outer portions of body 2, symmetrical to each other with respect to plane S2 and each symmetrical with respect to plane S1, and that the two other primary portions are inner portions of body 2, symmetrical to each other with respect to plane S1 and each symmetrical with respect to plane S2, when the frequency of primary voltage Up is at least substantially equal to a determined frequency fr, which will be specified hereinafter, the aforementioned alternating stresses cause a vibration of body 2 in a particular mode which will be termed a bielliptical mode, for a reason which will become clear hereinafter. As will be seen, this bielliptical mode, whose frequency fr is the fundamental resonance frequency, is completely different to the vibration modes of the known transformer bodies described hereinbefore, in which the general shape of the bodies remains unchanged.

This bielliptical vibration mode will be described in detail hereinafter with reference to FIG. 5.

Figure 5:
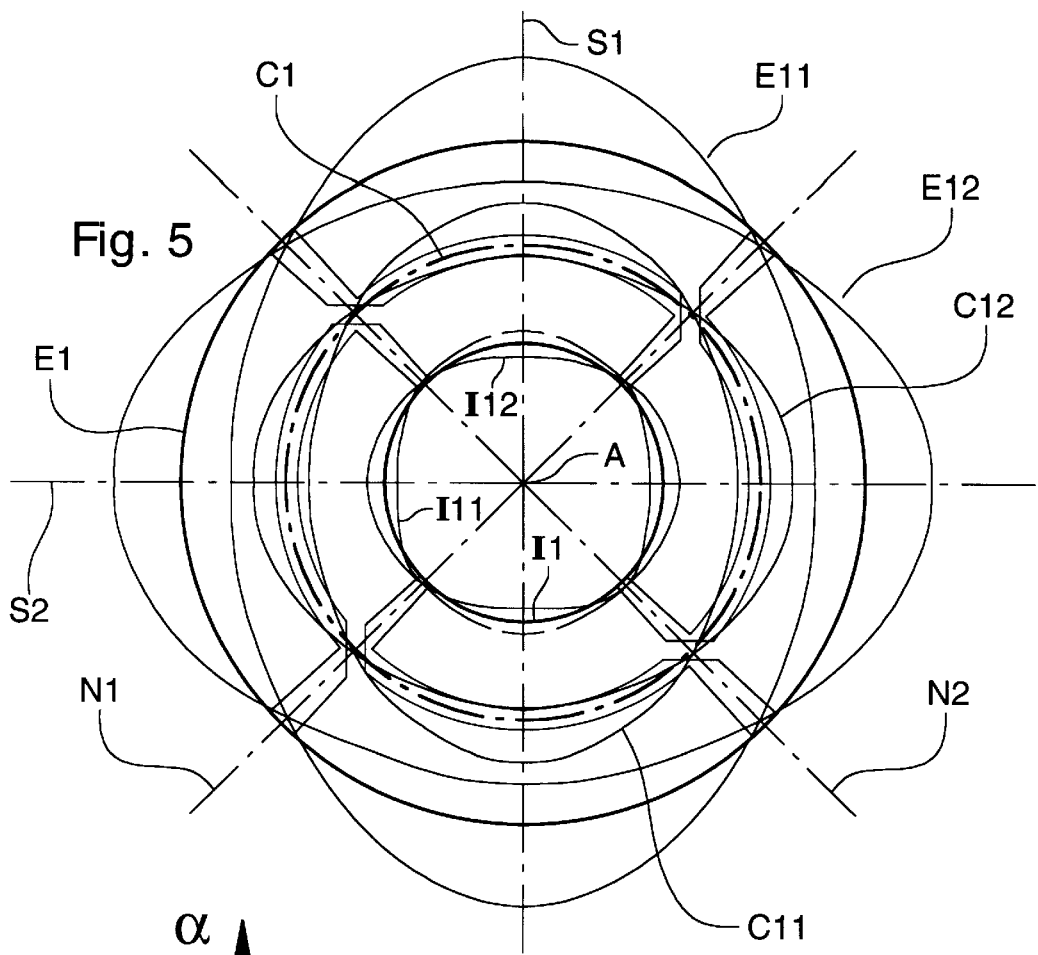
FIG. 5 illustrates schematically the deformation of the body of the transformer of FIGS. 1 to 3.

It should be noted that only face 3 of body 2 is visible in FIG. 5. Moreover, electrodes 5 to 12, conductive paths 13 to 16 and connection rods 29 to 32 arranged on this face 3 have not been shown in FIG. 5 to avoid overloading the drawing unnecessarily.

In FIG. 5, external contour E1 and internal contour I1 of face 3 are shown in full lines in the circular shape which they have when body 2 is not vibrating. Likewise, middle circle C1 is shown in dot and dash lines.

It should also be noted that, in order to simplify the following description, one will call the major axis or the minor axis of the various elliptical cylinders which will be mentioned, what is in fact the major axis, or respectively the minor axis of the ellipses formed by the intersection of these elliptical cylinders with any one of the planes perpendicular to axis A.

The particular vibration mode of body 2 mentioned hereinbefore is called bielliptical since, when this body vibrates in this mode, it alternately takes the shape of a first and a second elliptical ring. These elliptical rings are also variable as will be shown hereinafter.

In other words, when body 2 vibrates in this bielliptical mode, its outer wall E alternately takes the shape of a first and a second elliptical cylinder, which will be called outer elliptical cylinders, whereas inner wall I of this body 2 respectively takes the shape of another first and another second elliptical cylinder, which will be called the inner elliptical cylinders.

More precisely, the major axes of the first and second outer elliptical cylinders are respectively situated in planes S1 and S2, as are the major axes of the first and second inner elliptical cylinders. Moreover, the minor axes of the first and second outer elliptical cylinders are respectively situated in planes S2 and S1, as are the minor axes of the first and second inner elliptical cylinders. All these major and minor axes are obviously perpendicular to axis A.

Moreover, when outer wall E and inner wall I of body 2 have the shape of one of the aforementioned outer and, respectively, inner elliptical cylinders, the length of the major axis of each of these elliptical cylinders varies regularly increasing from a minimum value to a maximum value, then decreasing to its minimum value. The outer and inner walls E and I then take the shape of the other outer and, respectively, inner elliptical cylinder after having taken the circular cylinder shape which they have in the absence of vibration of body 2.

Simultaneously, the length of the minor axis of each of these elliptical cylinders also varies regularly but in a reverse direction, this length decreasing from a maximum value to a minimum value then increasing to its maximum value, so that the volume of body 2 remains constant.

It is obvious that when body 2 vibrates in the manner which has just been described, mean cylinder C also alternately takes the shape of a first and a second elliptical cylinder, which will be called mean elliptical cylinders, whose major axes are also respectively situated in planes S1 and S2, and whose minor axes are also respectively situated in planes S2 and S1. Moreover, the length of the major axes and the minor axes of these mean elliptical cylinders varies in a similar manner to that which has been described hereinbefore.

It is also to be noted that the minimum length of the major axis of each of the aforementioned outer, inner and mean elliptical cylinders, and the maximum length of the minor axis thereof, is obviously respectively equal to the diameter of outer wall E, inner wall I and mean cylinder C in the absence of vibration. The maximum length of these major axes and the minimum length of these minor axes depend upon various factors such as, for example, the mechanical and electromechanical features of the material of body 2, and the frequency and the amplitude of primary voltage Up. Those skilled in the art will easily understand that, all other things being equal, the maximum length of these major axes and the minimum length of these minor axes respectively have their largest and smallest value when the frequency of voltage Up is equal to fundamental resonance frequency fr of the bielliptical resonance mode of body 2.

FIG. 5 shows two examples of various ellipses formed by the intersection of the elliptical cylinders described hereinbefore with the plane of face 3 of body 2. These ellipses will be termed in the same way as the elliptical cylinders which form them.

Thus, in FIG. 5, an example of a first outer ellipse and an example of a second outer ellipse are shown in dotted lines and are respectively designated by the references E11 and E12.

Likewise, the corresponding first inner ellipse and second inner ellipse examples are shown, also in dotted lines, and are designated by the references I11 and I12.

Finally, the corresponding first mean ellipse and second mean ellipse examples are shown in dot and dash lines, and are respectively designated by the references C11 and C12.

It is to be noted that the various ellipses shown in FIG. 5 are greatly exaggerated, the difference between the maximum and minimum lengths of their major axes and minor axes being in practice less than one thousandth of these lengths.

The vibration of body 2 in the bielliptical mode described hereinbefore obviously causes the application of alternate mechanical contraction and expansion stresses, in directions perpendicular to axis A, of the four portions of body 2 which are respectively situated between pairs of electrodes 6 and 18, 8 and 20, 9 and 21 and 11 and 23. These four portions will be termed secondary portions in the following description.

In a known manner, aforementioned electromechanical coupling 31, between the alternating stresses and polarisation P of the material of body 2 causes an electric field F' to be generated in these secondary portions. This field F' is also alternating, and it has a parallel direction to that of polarisation P and a direction which is alternately the same as that of polarisation P and the opposite direction thereto. Again in a well known manner, this field F' causes secondary AC voltage Us to appear across the pairs of electrodes listed hereinabove, which delimit the secondary portions of body 2, and thus across terminals BS1 and BS2 of transformer 1.

In the example described above, a first and a second of the four secondary portions, i.e. those which are situated between electrodes 9 and 21 and, respectively, 11 and 23, are inner portions of body 2 and are respectively situated in the first and second of the zones defined hereinbefore, i.e. zones Z1 and Z3, where the first and, respectively the second primary portions which are also defined hereinbefore, are also situated. These first and second secondary portions are also symmetrical to each other with respect to plane S2, and each of them is symmetrical with respect to plane S1.

Likewise, the third and fourth secondary portions, i.e. those which are situated between electrodes 6 and 18 and, respectively, 8 and 20 are outer portions of body 2 and are respectively situated in the third and fourth zones defined hereinbefore, i.e. zones Z2 and Z4, where the third and, respectively, the fourth primary portions, which are also defined hereinbefore, are also situated. These third and fourth secondary portions are also symmetrical to each other with respect to plane S1, and each of them is symmetrical with respect to plane S2.

However, the material of body 2 is isotropic in all directions perpendicular to axis A. It follows that the portions of body 2 which have been selected, in the present example, to be primary portions, could equally have been selected to be secondary portions, and vice versa.

Likewise, the electrodes which have been selected to be primary electrodes, could equally have been selected to be secondary electrodes, and vice versa.

Generally, it can thus be said that each of faces 3 and 4 of body 2 of transformer 1 includes a first and a second primary electrode which are outer electrodes symmetrical to each other with respect to a first of planes S1 and S2 and each symmetrical with respect to the second of these planes S1 and S2.

Each of said faces 3 and 4 also includes a third and a fourth primary electrode which are inner electrodes symmetrical to each other with respect to the second of the planes defined hereinbefore and each symmetrical with respect to the first of said planes.

Moreover, each of faces 3 and 4 includes a first and a second secondary electrode which are inner electrodes symmetrical to each other with respect to the first of the planes defined hereinbefore and each symmetrical with respect to the second of said planes.

Finally, each of faces 3 and 4 includes a third and a fourth secondary electrode which are outer electrodes symmetrical to each other with respect to the second of the planes defined hereinbefore and each symmetrical with respect to the first of said planes.

It should be noted that, when body 2 vibrates in the bielliptical mode described hereinbefore, the first mean bielliptical cylinder which is also defined hereinbefore, intersects planes N1 and N2 along four straight lines parallel to axis A whose position is fixed whatever the vibration amplitude of body 2 and which are also those along which the mean circular cylinder intersects planes N1 and N2. Moreover, the second mean elliptical cylinder intersects said planes N1 and N2 along the same four straight lines.

These four straight lines are thus the bielliptical vibration nodal straight lines of body 2, and the points where they intersect the planes of faces 3 and 4 of body 2 are nodal points of said vibration. This is the reason why connection rods 29 to 32 are preferably fixed at these points as has already been mentioned.

Theoretical considerations which will not be repeated here show that fundamental resonance frequency fr of the bielliptical vibration mode of a ring such as body 2 is provided by the equation:

$$fr = \frac{\alpha}{2\Pi \cdot Re} \cdot \sqrt{\frac{E}{\rho \cdot (1-v^2)}} \quad (1)$$

in which:
Re is the outer radius of body 2 in the absence of vibration by body 2;
α is an analytically determined coefficient which depends on the ratio Ri/Re between inner radius Ri and the outer radius Re of body 2 also in the absence of vibration of the latter;
E is the Young module of the material of body 2;
ρ is the specific mass of the material of body 2; and
μ is the poisson coefficient of the material of body 2.

Figure 6:
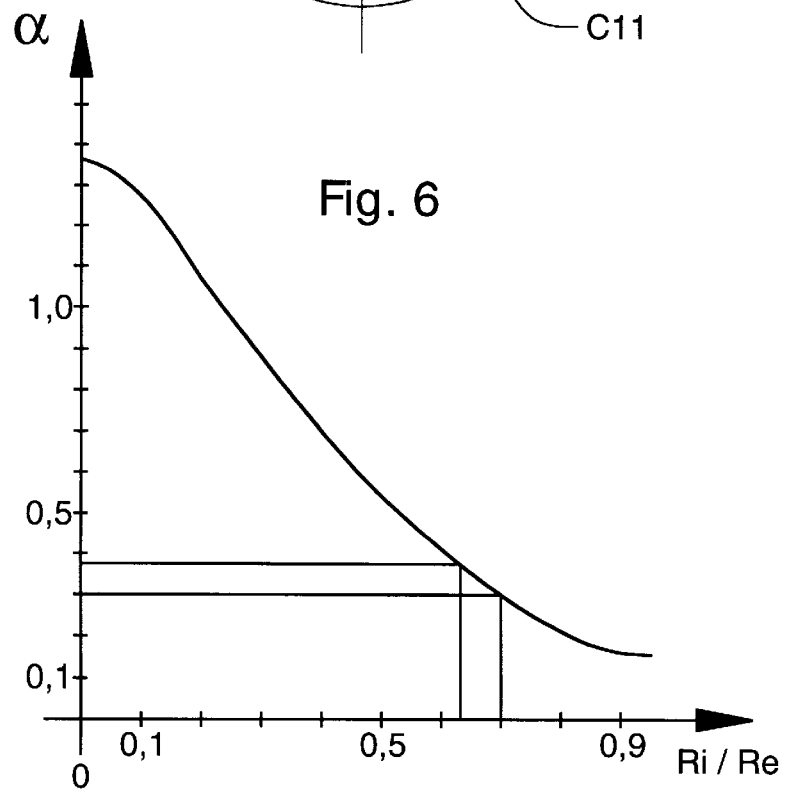
FIG. 6 illustrates schematically a feature of the body of the transformer of FIGS. 1 to 3.

FIG. 6 illustrates the variation in aforementioned coefficient α as a function of the ratio Ri/Re between inner radius Ri and outer radius Re of body 2. It can be seen that this coefficient α varies, in the present case, from approximately 1.37 for a ratio Ri/Re equal to zero, i.e. for a solid disc, to approximately 0.17 for a ratio Ri/Re equal to 0.9.

If the ceramic material commonly called PZT (lead zirconate titanate), which is well known and frequently used, is used as the material for body 2:
E=67·10$^9$ Pascals;
ρ=7,5·10$^3$ kgm$^{-3}$; et
μ=0,3.

Moreover, if values equal for example to 8 mm and, respectively 5 mm are arbitrarily selected for outer radius Re and inner radius Ri of body 2, and thus a ratio Ri/Re equal to 0.625, FIG. 6 shows that coefficient α has a value of approximately 0.38.

In these circumstances, according to the above equation (1):

fr=23.68 kHz

If one wishes resonance frequency fr to have a determined value, for example 25 kHz, and radius Re to be equal, again for example, to 6 mm, the above equation (1) shows that, for the same material as in the preceding example, coefficient α must be equal to 0.30. The ratio Ri/Re must thus be equal to 0.7 according to FIG. 6, which gives a value of 4.2 mm for inner radius Ri of said body 2.

The aforementioned theoretical considerations also show that when the secondary portion of transformer 1 is not connected to any load and the frequency of voltage Up is equal to the fundamental resonance frequency given by the above equation (1), the ratio between secondary voltage Us and primary voltage Up, i.e. the off-load utility factor T of transformer 1 is provided by the following equation:

$$T = \frac{Us}{Up} = \frac{Q \cdot k^2}{1 - k^2} \quad (2)$$

in which:
Q is the excess-voltage factor, or quality factor, of body 2 and depends upon the mechanical features of the material of said body 2; and
k is the effective electromechanical coupling coefficient of the material of body 2 in coupling mode 31 which is used in the present example and has already been mentioned.

It can be seen that this utility factor depends only upon the features of the material of body 2 and not upon the dimensions of the latter.

When the material of body 2 is that which has been mentioned in above examples:

Q=800; and k=0.2.

In this case, according to the above equation (2):

T=33.3

It should be noted that the thickness of body 2, i.e. its dimension in the direction parallel to axis A, does not appear in the above equations (1) and (2), so that resonance frequency fr and utility factor T are independent of such thickness. Those skilled in the art will understand that the mechanical resistance of body 2, which obviously depends upon its thickness, must however be sufficient for it to resist the mechanical stresses to which it is subjected during its vibration without any damage.

Moreover, those skilled in the art will also understand that the thickness of body 2 influences the primary and secondary impedance value of transformer 1.

The theoretical considerations referred to hereinbefore, which also allow the value of the mechanical stresses which body 2 undergoes during its vibration to be calculated, show that said body 2 can generally have a thickness of the order of 1 mm, or even less than 1 mm, according to the material of which it is made, without its mechanical resistance becoming insufficient. The exact value of this thickness is obviously determined so that the primary and secondary impedance have the desired values.

Figure 7:
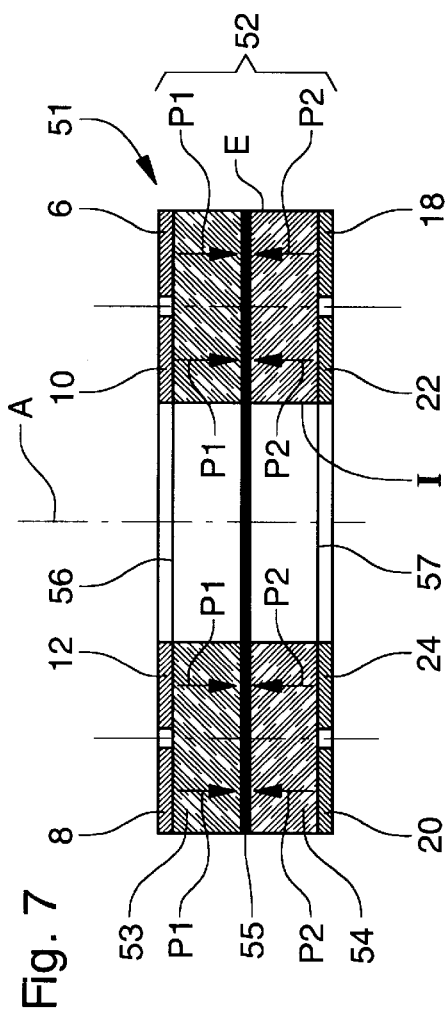
FIG. 7 shows schematically another embodiment of the transformer according to the present invention.

FIG. 7 illustrates another embodiment of the transformer according to the present invention, which is designated in this case by the general reference 51.

Transformer 51 includes a body 52 including two identical parts in the shape of circular rings 53 and 54 having a circular axis of symmetry also designated by the reference A.

Rings 53 and 54 are made of a piezoelectric material which can also be any of the piezoelectric materials well known to those skilled in the art, and they are fixed to each other via a thin metal layer of an electrically conductive material, which covers the whole of the surfaces of rings 53 and 54 facing each other. It will be seen hereinafter that this metal layer forms a common electrode which will be designated by the reference 55.

The piezoelectric material of rings 53 and 54 is uniformly polarised in a direction parallel to axis A but the direction of polarisation of the material of ring 53 is opposite to the direction of polarisation of the material of ring 54. In the example shown in FIG. 7, these polarisations, which are symbolised by the arrows respectively designated by the references P1 and P2, are directed from outer faces 56 and 57 of rings 53 and 54 towards electrode 55. Those skilled in the art will easily understand that these polarisations P1 and P2 can equally be directed in the opposite directions.

Transformer 51 also includes electrodes arranged on outer faces 56 and 57 of rings 53 and 54, conductive paths connecting these electrodes in pairs, and connection rods intended to allow these electrodes to be connected to a primary AC voltage and to the device which the secondary AC voltage is intended to supply. These components of transformer 51 will not be described again here since they are identical to the corresponding components of transformer 1 shown in FIGS. 1 and 3 and will be designated by the same references as the latter.

Figure 8:
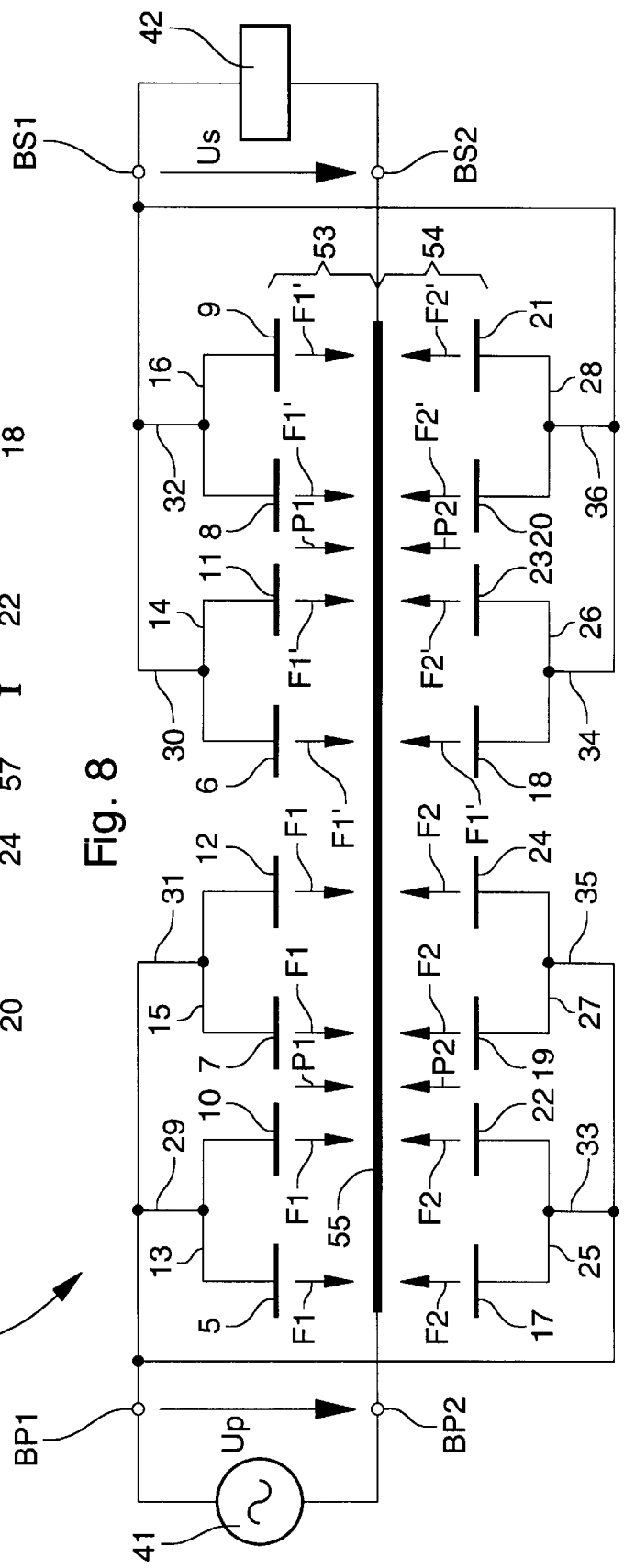
FIG. 8 illustrates schematically a way of operating the transformer of FIG. 7.

FIG. 8 illustrates a way of operating transformer 51 which has just been described.

In this case, connection rods 29 and 31 are connected to each other and to the first primary terminal BP1, as in the case of transformer 1 illustrated in FIG. 4. Moreover, connection rods 33 and 35 are also connected to each other, as in the case of FIG. 4, but they are however also connected to the first primary terminal BP1.

Likewise, connection rods 30 and 32 are connected to each other and to the first secondary terminal BS1, as in the case of FIG. 4. Moreover, connection rods 34 and 36 are connected to each other, as in the case of FIG. 4, but they are however also connected to the first secondary terminal BS1.

Finally, common electrode 55 is connected to the second primary terminal BP2 and to the second secondary terminal BS2.

The source intended to supply the primary voltage, also designated by Up, and the device to which transformer 51 must supply the secondary voltage, also designated by Us, are also shown in FIG. 8 with the same references 41 and, respectively, 42 as in the case of FIG. 4.

By analogy with transformer 1 described hereinbefore, the portions of ring 53 which are situated between common electrode 55 and electrodes 5, 7, 10 and 12 will be called the primary portions thereof. Likewise, the primary portions of ring 54 which are situated between common electrode 55 and electrodes 17, 19, 22 and 24 will be called the primary portions thereof. Moreover, the portions of body 52 which are formed by one of the primary portions of ring 53 and by the primary portion of ring 54 situated facing the latter will be called the primary portions thereof. These primary portions of body 52 are thus those which are respectively situated between the pairs of electrodes, 5 and 17, 7 and 19, 10 and 22, and 12 and 24. These electrodes 5, 7, 10, 12, 17, 19, 22 and 24 will be termed primary electrodes.

Again by analogy with transformer 1, the portions of ring 53 which are situated between common electrode 55 and electrodes 6, 8, 9 and 11 will be called the secondary portions thereof. Likewise, the portions of ring 54 which are situated between common electrode 55 and electrodes 18, 20, 21 and 23 will be called the secondary portions thereof. Moreover, the portions of body 52 which are formed by one of the secondary portions of ring 53 and by the secondary portion of ring 54 situated facing the latter will be called the secondary portions thereof. These secondary portions of body 52 are thus those which are respectively situated between the pairs of electrodes, 6 and 18, 8 and 20, 9 and 21, and 11 and 23. These electrodes 6, 8, 9, 11, 18, 20, 21 and 23 will be called secondary electrodes.

It can be seen that the primary portions and the secondary portions of body 52 are arranged in relation to each other exactly as those of body 2 of transformer 1. Likewise, on each of faces 56 and 57 of body 52, the primary electrodes and the secondary electrodes are arranged in relation to each other exactly as those which are situated on faces 3 and 4 of body 2 of transformer 1.

It can also be seen that the electric fields F1 and F2 respectively generated in the primary portions of ring 53 and ring 54 in response to primary voltage Up always have simultaneously, either the same direction as respective polarisations P1 and P2, or the opposite direction to that of said polarisations.

The transverse electromechanical coupling of field F1 with the material of ring 53 and of field F2 with the material of ring 54 thus drives the application of identical mechanical stresses onto all the primary portions of said rings 53 and 54, and these stresses cause alternately contraction and expansion of said primary portions in all directions perpendicular to axis A.

These primary portions of rings 53 and 54 form in pairs the primary portions of body 52 as defined hereinbefore, it follows from the foregoing that when the frequency of primary voltage Up is at least substantially equal to frequency fr defined hereinbefore by the equation (1), body 52 of transformer 51 also vibrates in the bielliptical mode also described hereinbefore in the case of transformer 1. This bielliptical vibration mode will not therefore be described again here.

Likewise, when body 52 of transformer 51 vibrates in this bielliptical mode, the secondary portions of rings 53 and 54 are still subjected to the same mechanical stresses, so that the electric fields F1' and F2' generated in these secondary portions always have either the same direction as respective polarisations P1 and P2, or the opposite direction to that of said polarisations P1 and P2.

The voltages which are generated in response to these fields F1' and F2' between common electrode 55 and electrodes 6, 8, 9 and 11 on the one hand and electrodes 18, 20, 21 and 23 on the other hand thus always have the same polarity and together form secondary voltage Us.

The ratio between voltages Us and Up, i.e. utility factor T of transformer 51, is also provided by the aforementioned equation (2), and it is thus identical to that of transformer 1 described hereinbefore.

Figure 9:
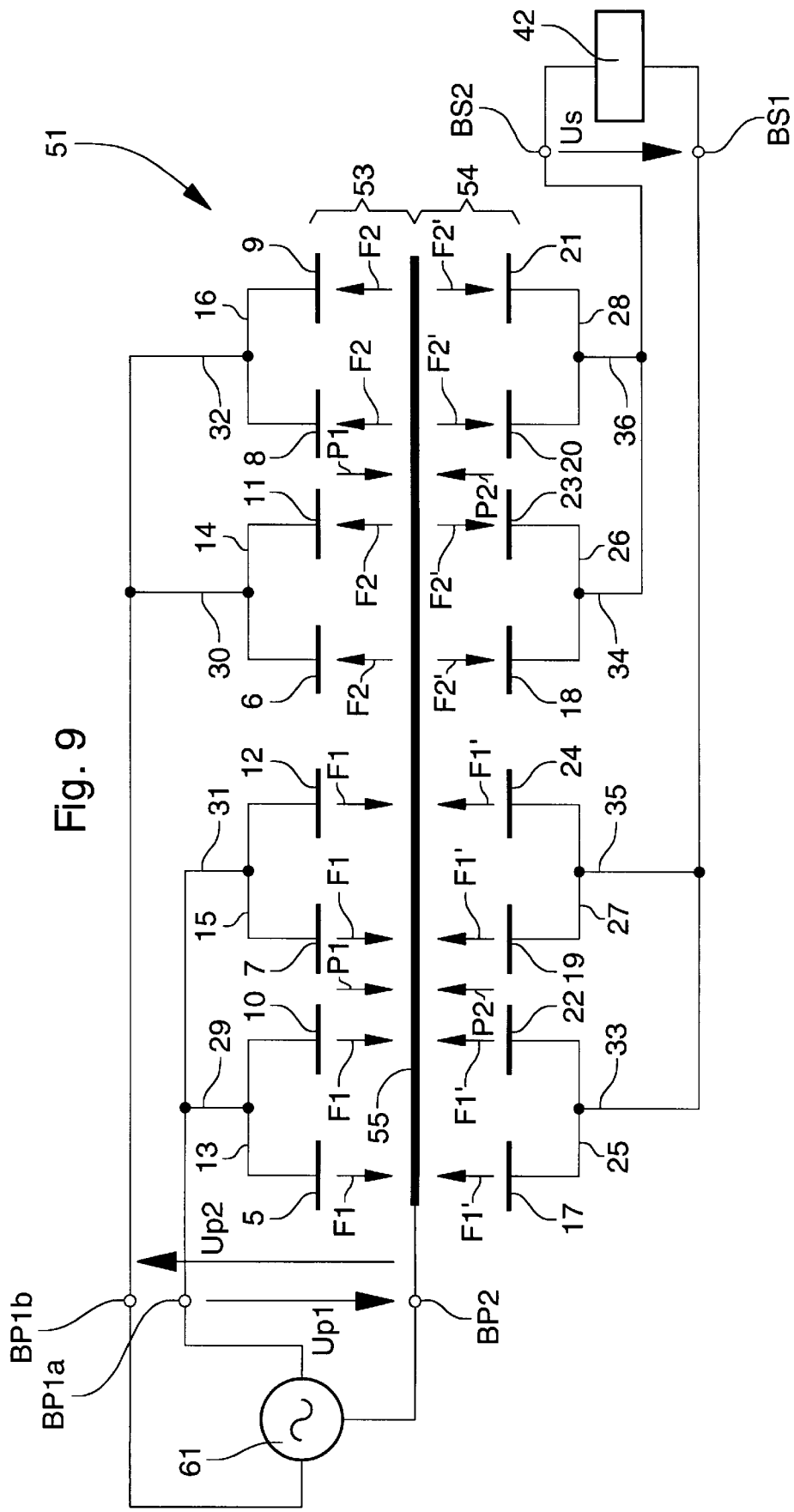
FIG. 9 illustrates schematically another way of operating the transformer of FIG. 7.

FIG. 9 illustrates another way of operating transformer 51 described with reference to FIG. 7.

In this case, connection rods 29 and 31 are connected to each other and to a first primary terminal BP1a, whereas connection rods 30 and 32 are connected to each other and to a second primary terminal BP1b.

Common electrode 55 is connected to a third primary terminal BP2.

Again in this case, connection rods 33 and 35 are connected to each other and to a first secondary terminal BS1, whereas connection rods 34 and 36 are connected to each other and to a second secondary terminal BS2.

In this case, transformer 51 is supplied by a source, designated by 61, which supplies two AC voltages Up1 and Up2 together forming primary voltage Up, which have the same frequency and the same amplitude, but which are phase shifted by 180° with respect to each other. In other words, these voltages Up1 and Up2 have polarities which are always opposite to each other. This source 61 will not e described in more detail, since the realisation thereof is within the grasp of those skilled in the art. Source 61 is connected to terminals BP1a, BP1b and P2 so that voltage Up1 is applied across terminal BP1a and terminal BP2, and that voltage Up2 is applied across terminal BP1b and the same terminal BP2.

It can be seen that, in this case, the primary portions of body 52 form two groups, the first of these groups being formed by the primary portions situated between common electrode 55 and electrodes 5, 7, 10 and 12 and the second of these groups being formed by the primary portions situated between said common electrode 55 and electrodes 6, 8, 9 and 11.

Likewise, the secondary portions of body 52 also form two groups the first of which is formed by the secondary portions situated between common electrode 55 and electrodes 17, 19, 22 and 24 and the second of which is formed by the secondary portions situated between said common electrode 55 and electrodes 18, 20, 21 and 23.

In this case, all the primary portions and all the secondary portions thus belong respectively to ring 53 and ring 54.

It can also be seen that in the primary portions of the first group and in the primary portions of the second group, respective electric fields F1 and F2 generated in response to voltages Up1 and Up2 always have opposite directions to each other, each of these fields F1 and F2 also having either the same direction as polarisation P1 of the material of ring 53 or the opposite direction to that of said polarisation P1.

It follows that when the primary portions of the first group are subjected, for example, to mechanical expansion stress, the primary portions of the second group are subjected to mechanical contraction stress, and vice versa.

It can also be seen that, in each of zones Z1 and Z3, the outer portions, i.e. those which are respectively situated facing electrodes 5 and 7, belong to the first group of these primary portions, whereas the inner portions, i.e. those which are respectively situated facing electrodes 9 and 11, belong to the second group of primary portions.

Likewise, in each of the other zones Z2 and Z4, the outer portions, i.e. those which are respectively situated facing electrodes 6 and 8, belong to the second group of primary portions, whereas the inner portions, i.e. those which are respectively situated facing electrodes 10 and 12, belong to the first group of primary portions.

It follows from the foregoing that, generally, when the outer portions situated in two diametrically opposite zones Z1 to Z4 are subjected, for example, to contraction stress, the inner portions situated in the same zones are subjected to expansion stress. Moreover, the outer portions situated in the two other zones are simultaneously subjected to expansion stress, whereas the inner portions situated in these latter zones are subjected to contraction stress.

The effect of this distribution of stress in the various primary portions of body 52 is that the latter vibrates equally in the bielliptical mode described hereinbefore when the frequency of voltages Up1 and Up2 is at least substantially equal to frequency fr defined hereinbefore by the equation (1).

Likewise, when body 52 of transformer 51 vibrates in this bielliptical mode and the secondary portions of the first group are subjected, in response to this vibration, to mechanical expansion stress, for example, the secondary portions of the second group are subjected to mechanical contraction stress, and vice versa.

It follows that electric fields F1' and F2' respectively generated in these secondary portions of the first group and in these secondary portions of the second group always have opposite directions. Moreover, the voltages generated in response to these fields F1' and F2' between common electrode 55 and electrodes 17, 19, 22 and 24 on the one hand and electrodes 18, 20, 21 and 23 on the other hand, which obviously have the same frequency and the same amplitude, always have opposite polarities to each other.

When connection rods 33 to 36 are connected in the manner described hereinbefore and shown in FIG. 9, these two voltages are thus added together to form secondary voltage Us generated by transformer 51.

In this case, transformer utility factor T is also given by the aforementioned equation (2).

It can be seen that, for a comparable space requirement, the fundamental resonance frequency of the bielliptical mode of the transformer body according to the present invention is very considerably lower than that of the vibration modes of the known transformer bodies described hereinbefore.

A transformer according to the present invention can thus provide a secondary voltage having a frequency which is also considerably lower than that provided by a known transformer.

Moreover, the utility factor of a transformer according to the present invention is of the same order as that of a known transformer, or even higher than the latter.

A transformer according to the present invention is thus particularly well suited to being used in a device such as a wristwatch where the available space is limited, and in all cases where it is necessary to obtain a relatively high AC voltage having a relatively low frequency.

Moreover, the fact that the piezoelectric material from which the transformer body according to the present invention, or each of the parts forming such body, is made, is uniformly polarised in the direction perpendicular to its faces simplifies the manufacture of said body and reduces the cost price of the transformer.

It is obvious that numerous modifications can be made to the transformer according to the present invention whose embodiments have been described hereinbefore, without thereby departing from the scope of this invention.

Thus, for example, it is possible to give the transformer body according to the present invention the shape of a solid disc, without any central opening, said disc being able to be made of a single part, like body 2 of transformer 1 of FIGS. 1 to 3, or be formed of two identical parts like body 52 of transformer 1 of FIG. 7.

Likewise, the various electrodes arranged on the body of the transformer according to the present invention can have different shapes to that of the examples described, and their connections can be achieved differently.

Those skilled in the art will also see that it is not compulsory to provide as many secondary electrodes as in the examples described hereinbefore. Indeed, it would be sufficient to provide only a single pair of secondary electrodes, for example electrodes 6 and 18, or 11 and 23 of FIGS. 4 and 8, or electrodes 17 and 18, or 21 and 22 of FIG. 9.

What is claimed is:

1. A piezoelectric transformer including:

a body made of piezoelectric material having a first and a second face and an outer lateral surface;

a plurality of primary electrodes arranged on said body to cause said body to vibrate in response to a primary alternative voltage; and a plurality of secondary electrodes arranged on said body to generate a secondary voltage in response to said vibration;

said outer surface having, in the absence of said vibration, the shape of a first circular cylinder having a circular axis of symmetry and said faces each having an outer portion situated on the side of said outer lateral surface and an inner portion surrounded by said outer portion, wherein said primary electrodes are arranged so that, when said primary voltage has a frequency at least substantially equal to a determined frequency, said outer lateral surface alternately takes the shape of a first elliptical cylinder and the shape of a second elliptical cylinder, said first elliptical cylinder having a major axis and a minor axis perpendicular to said circular axis of symmetry and respectively situated in a first plane of symmetry including said circular axis of symmetry and a second plane of symmetry perpendicular to said first plane of symmetry and also including said circular axis of symmetry, said second elliptical cylinder having a major axis and a minor axis perpendicular to said circular axis of symmetry and respectively situated in said second plane of symmetry and said first plane of symmetry, and, when said outer lateral surface has the shape of one of said first and second elliptical cylinders, the respective major axis having a length which varies regularly increasing from a minimum value equal to the diameter of said circular cylinder to a maximum value then decreasing from said maximum value to said minimum value, said outer lateral surface then taking the shape of the other of said first and second elliptical cylinders.

2. A piezoelectric transformer according to claim 1, wherein said body is formed of a single part and wherein said piezoelectric material is uniformly polarised in a direction parallel to said circular axis of symmetry and in a direction going from one to the other of said first and second faces of said body.

3. A piezoelectric transformer according to claim 1, wherein said body includes a first and a second part, wherein the piezoelectric material of said first part is uniformly polarised in a direction parallel to said circular axis of symmetry and in a first direction going from one to the other of said first and second faces of said body, wherein the material of said second part is uniformly polarised in said direction parallel to said circular axis of symmetry and in a second direction opposite to said first direction, and wherein said transformer includes a common electrode arranged between said first and said second part of said body.

4. A piezoelectric transformer according to claim 2 or 3, wherein said plurality of primary electrodes includes;

a first and a second primary electrode each symmetrical with respect to said first plane of symmetry, symmetrical to each other with respect to said second plane of symmetry and both arranged on said outer portion of said first face of said body;

a third and a fourth primary electrode, each symmetrical with respect to said second plane of symmetry, symmetrical to each other with respect to said first plane of symmetry and both arranged on said outer portion of said first face of said body; and a fifth and a sixth, a seventh and an eighth primary electrode all arranged on said second face of said body facing said first, said second, said third and, respectively, said fourth primary electrode.

5. A piezoelectric transformer according to claim 4, wherein it includes means for electrically connecting said first and said third primary electrodes, said second and said fourth primary electrode, said fifth and said seventh primary electrodes, and said sixth and said eighth primary electrodes.

6. A piezoelectric transformer according to claim 4, wherein said plurality of secondary electrodes includes at least a first secondary electrode which is arranged on said first face of said body between said first and said second primary electrode and is symmetrical with respect to said second plane of symmetry, and a second secondary electrode arranged on said second face of said body facing said first secondary electrode.

7. A piezoelectric transformer according to claim 6, wherein said plurality of secondary electrodes further includes:

a third and a fourth secondary electrode, arranged facing each other on said first and, respectively, on said second face of said body and respectively symmetrical to said first and said second secondary electrode with respect to said first plane of symmetry; and a fifth and a sixth secondary electrode arranged facing each other on said first and respectively, on second face of said body, and situated between said third and said fourth primary electrode and, respectively, said seventh and said eighth primary electrode; and a seventh and an eighth secondary electrode arranged facing each other on said first and, respectively, said second face of said body and respectively symmetrical to said fifth and said sixth secondary electrode with respect to said second plane of symmetry.

8. A piezoelectric transformer according to claim 4, herein said plurality of secondary electrodes includes at least a first secondary electrode arranged on said first face of said body between said third and said fourth primary electrode and symmetrical with respect to said first plane of symmetry, and a second secondary electrode arranged on said second face of said body facing said first secondary electrode.

9. A piezoelectric transformer according to claim 3, wherein said plurality of primary electrodes includes:
- a first and a second primary electrode, each symmetrical with respect to said first plane of symmetry, symmetrical to each other with respect to said second plane of symmetry and both arranged on said outer portion of said first face of said body;
- a third and a fourth primary electrode, each symmetrical with respect to said second plane of symmetry, symmetrical to each other with respect to said first plane of symmetry and both arranged on said inner portion of said first face of said body;
- a fifth primary electrode symmetrical with respect to said second plane of symmetry and arranged between said first and said second primary electrode;
- a sixth primary electrode symmetrical to said fifth primary electrode with respect to said first plane of symmetry;
- a seventh primary electrode symmetrical with respect to said first plane of symmetry and arranged between said third and said fourth primary electrode; and
- an eighth primary electrode symmetrical to said seventh primary electrode with respect to said second plane of symmetry.

10. A piezoelectric transformer according to claim 9, wherein it includes means for electrically connecting said first and said third primary electrode, said second and said fourth primary electrode, said fifth and said eighth primary electrode, and said sixth and said seventh primary electrode.

11. A piezoelectric transformer according to claim 9, wherein said plurality of secondary electrodes includes at least a first and a second secondary electrode arranged on said second face of said body facing one of said first, second, third and fourth primary electrode and, respectively, facing one of said fifth, sixth, seventh and eighth primary electrode.

12. A piezoelectric transformer according to claim 9, wherein said plurality of secondary electrodes includes eight secondary electrodes arranged on said second face of said body, each facing one of said primary electrodes.

13. A piezoelectric transformer according to claim 2, wherein said body has the general shape of a solid disc.

14. A piezoelectric transformer according to claim 2, wherein said body has the general shape of a ring including an inner lateral surface having, in the absence of said vibration, the shape of a second circular cylinder coaxial with said first circular cylinder, said inner lateral surface alternately taking the shape of a third elliptical cylinder and the shape of a fourth elliptical cylinder when said outer lateral surface takes the shape of said first elliptical cylinder and, respectively, the shape of said second elliptical cylinder, said third elliptical cylinder having a major axis and a minor axis perpendicular to said circular axis of symmetry and situated respectively in said first and in said second plane of symmetry, and said fourth elliptical cylinder having a major axis and a minor axis perpendicular to said circular axis of symmetry and situated respectively in said second and in said first plane of symmetry.

* * * * *